United States Patent [19]

Lofgren et al.

[11] Patent Number: 4,716,383

[45] Date of Patent: Dec. 29, 1987

[54] PRECISE PHASE START-UP VOLTAGE CONTROLLED OSCILLATOR WITH ACCURATE DUTY CYCLE

[75] Inventors: Karl M. J. Lofgren, Long Beach; Gerald W. Shearer, Orange; Kenneth W. Ouyang, Huntington Beach, all of Calif.

[73] Assignee: Western Digital Corporation, Irvine, Calif.

[21] Appl. No.: 877,367

[22] Filed: Jun. 23, 1986

[51] Int. Cl.⁴ .............................................. H03K 3/02
[52] U.S. Cl. .............................. 331/117 FE; 331/111; 331/143
[58] Field of Search ............. 331/74, 75, 111, 117 FE, 331/117 R, 167, 177 V, 143; 307/260, 261, 279, 288; 328/28

[56] References Cited

U.S. PATENT DOCUMENTS 4,479,097 10/1984 Larson et al. ...................... 331/111

Primary Examiner—Eugene R. Laroche
Assistant Examiner—Robert J. Pascal
Attorney, Agent, or Firm—Spensley Horn Jubas & Lubitz

[57] ABSTRACT

A voltage controlled oscillator includes an inverting amplifier connected to a resonant feedback network and a comparator for comparing the input to the inverting amplifier to a reference voltage which is equal to the threshold voltage of the inverting amplifier. As a result, the oscillator provides a square wave output having a precise one-to-one duty cycle. In addition, circuitry is included for causing the oscillator to start up at a steady state value and predetermined phase.

14 Claims, 2 Drawing Figures

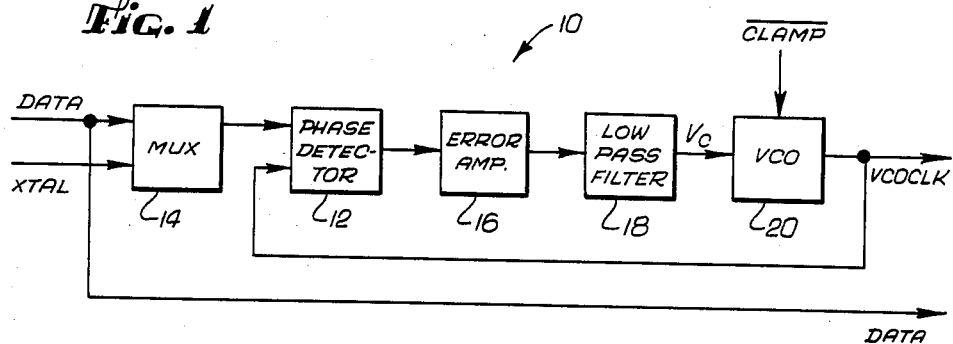
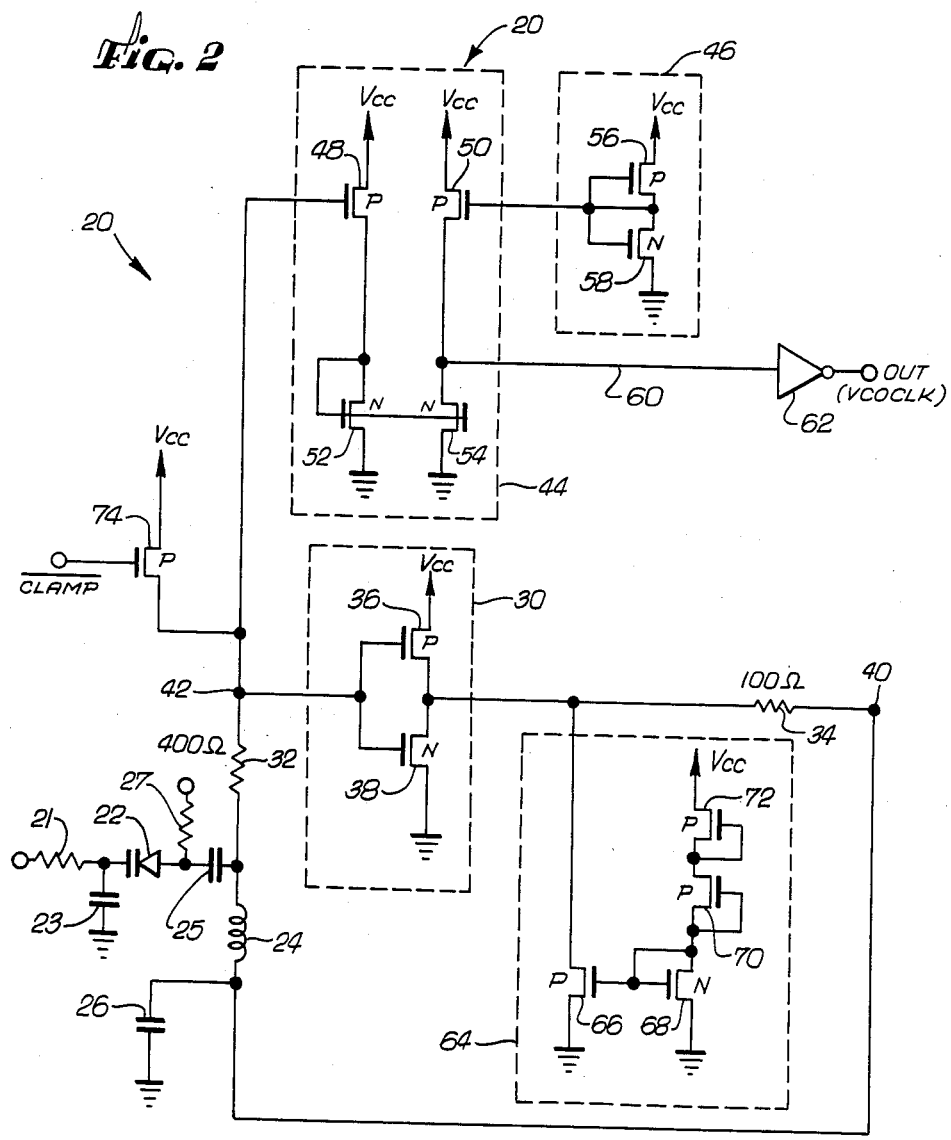

PRECISE PHASE START-UP VOLTAGE CONTROLLED OSCILLATOR WITH ACCURATE DUTY CYCLE

BACKGROUND OF THE INVENTION

1. Field of the Invention

The present invention relates to voltage controlled oscillators and more particularly to voltage controlled oscillators intended for use in phase-locked loop systems. Still more particularly, the present invention is directed to a voltage controlled oscillator for use in a phase-locked loop data separation circuit for use in disc drive systems.

Typically, information is recorded on magnetic discs in disc drive systems in the form of data pulses combined with clock pulses. In order to read information from the disc, signals from a magnetic head are applied to a data synchronization circuit which generates a recovered clock signal based upon the detection of data and clock pulses. The recovered clock signal corresponds to the pulse rate of the signals read from the disc and is used to separate the data and clock pulses. The generation of the recovered clock signal is accomplished by means of a phase-locked loop system. The phase-locked loop system typically employs a voltage controlled oscillator which is controlled so as to generate an output signal having a frequency equal to the data rate. The input to the voltage controlled oscillator is a control signal representative of the phase error between the incoming signal from the disc and the output of the phase-locked loop.

2. Description of the Prior Art

Prior art voltage controlled oscillators for use in data separators have typically been comprised of an inverting amplifier connected to a resonant feedback network such as an LC network. A varactor forms part of the feedback network and the voltage applied to the varactor determines the oscillation frequency. The output of the amplifier is the oscillator output. Although generally acceptable, such oscillators have several drawbacks. First, the duty cycle of the oscillator is not balanced, i.e., the high and low signal levels for each cycle are not of equal duration. Secondly, such oscillators typically have a start-up delay before they reach the desired operating phase due to small, slowly increasing amplitude of the oscillations.

SUMMARY OF THE INVENTION

The present invention is directed to a voltage controlled oscillator which provides an extremely precise duty cycle and which is controllable so that it will start precisely in phase with an input signal. The provision of an output signal having a 50% duty cycle enables the signal to be used to control data synchronization functions which otherwise would have to be controlled in a different fashion. The oscillator includes an inverting amplifier and a resonant network feedback loop. The inverting amplifier oscillates between a high and low level depending on the value of its input from the resonant network. The input to the inverting amplifier is also connected to a comparator having a reference voltage applied to it which is precisely equal to the threshold voltage of the inverting amplifier. Since the input to the amplifier is a very precise sine wave centered about the threshold voltage of the amplifier, the output of the comparator will be a precise square wave having a 50% duty cycle. The comparator output functions as the output of the oscillator.

In addition to providing an output having a 50% duty cycle, the oscillator of the present invention includes circuitry to ensure that the oscillator output will start-up precisely in phase with an input signal. This is accomplished by including a transistor which connects the resonant network to a supply voltage to preset the output of the oscillator. In order to start the oscillator, the supply voltage is disconnected from the resonant network, thus allowing oscillations to commence at the desired frequency and phase.

BRIEF DESCRIPTION OF THE DRAWINGS

The invention will be described with reference to the accompanying drawings wherein:

FIG. 1 is a block diagram of a phase-locked loop system employing the voltage controlled oscillator of the present invention; and FIG. 2 is a schematic diagram of the voltage controlled oscillator of the present invention.

DESCRIPTION OF THE PREFERRED EMBODIMENT

The following description is of the best presently contemplated mode of carrying out the invention. This description is made for the purpose of illustrating the general principles of the invention and is not to be taken in a limiting sense. The scope of the invention is best determined by reference to the appended claims.

Referring to FIG. 1, a phase detector 12 of a phase-locked loop system 10 receives an input signal from a multiplexer 14. The input signal is either a data signal of pulses from a disc drive or a reference signal from a crystal oscillator. The data rate is nominally equal to the frequency of the reference. When data is not being received from the disc drive, the reference signal is applied to the phase-locked loop in order to have it running at or near the desired frequency.

The signal from the multiplexer is compared to an output signal of the phase-locked loop by the phase detector 12. The output signal is labeled VCOCLK. The phase detector provides an error signal whose duration is proportional to the phase error between the output signal and the signal from the multiplexer 14. This error signal is amplified by an error amplifier 16 and filtered by means of a low pass filter 18 to provide a control voltage Vc representative of the phase error between the input to the phase-locked loop and the output of the phase-locked loop.

The error voltage is applied to a voltage controlled oscillator 20 which provides an output signal having a frequency proportional to the input control voltage. The VCO also receives a $\overline{\text{CLAMP}}$ signal, the function of which will be described subsequently. The output signal VCOCLK of the VCO 20 is thus a signal which is phase and frequency locked to the input signal from the multiplexer 14. During normal operation, the VCO output will therefore be locked in frequency and phase with the data input signal. The output signal VCOCLK is then used to separate data and clock signals from the signal read from the disc drive. The actual manner of data separation is not a part of the present invention and will therefore not be described. However, it is to be noted that the particular data separation technique employed relies upon an output signal from the VCO 20 which has a precise duty cycle. The VCO of the present invention is configured to provide an output having a very precise duty cycle for such data separation applications.

The VCO 20 is shown in detail in FIG. 2. The control voltage Vc is applied via a resistor 21 to one terminal of a varactor 22 which forms a part of an LC series resonant network which also includes an inductor 24 and capacitors 23, 25 and 26. A bias voltage to control the center frequency of the VCO is applied via a resistor 27. These elements are connected in a feedback loop of an inverting amplifier 30 via an input resistor 32 and an output resistor 34, all of which are monolithically formed. The inverter 30 is formed of a P-type transistor 36 and an N-type transistor 38. The output of the inverter is of a polarity opposite to its input, and it will switch at a threshold determined by the relative channel dimensions of the transistors 36 and 38.

The inverting amplifier 30 in combination with the positive feedback network forms an oscillator circuit similar to those employed in prior art systems, with an output being obtained at point 40. The voltage applied to the varactor 22 controls the capacitance of the varactor and therefore the frequency obtained at the point 40. However, the signal obtained at this point does not have a good duty cycle because of differing rise and fall times of the inverter, and thus is not suitable for certain applications.

The operation of the inverter 30 and series resonant circuit is such that the input to the inverter 30 at point 42 will be an extremely precise sine wave centered about the switching threshold of the inverter. The frequency of the sine wave is alterable by changing the voltage applied to the varactor 22. In order to obtain a square wave having a precise 50% duty cycle, the signal at point 42 is applied to one input of a comparator 44 and compared to a reference voltage provided by reference voltage generator 46. The comparator 44 is comprised of P-type transistors 48 and 50 having their sources connected to a supply voltage Vcc and N-type transistors 52 and 54 having their drains connected to the drains of the transistors 48 and 50, respectively, and their sources connected to ground. The reference voltage generator 46 is comprised of a P-type transistor 56 and an N-type transistor 58 having their gates and drains interconnected.

Since the signal at point 42 is a sine wave centered about the switching threshold of the inverter 30, a square wave output from the comparator 44 having a precise 50% duty cycle can be obtained by setting the reference voltage from the generator 46 equal to the switching threshold of the inverter 30. This is easily accomplished by fabricating the transistors 56 and 58 so that their channel dimension ratio is the same as the channel dimension ratio of the transistors 36 and 38 of the inverter 30. That is, although the transistor 56 need not be equal in size to the transistor 36 and the transistor 58 need not be equal in size to the transistor 38, the ratios of the channel dimensions of the transistors 56 and 58 is the same as the ratio of the channel sizes of the transistors 36 and 38. The comparator 44 will thus have a switching threshold precisely equal to the threshold of the inverter 30 and will be precisely centered with respect to the sine wave input to the comparator 44. The comparator output on line 60 will thus be a square wave having a very precise duty cycle, i.e., high and low levels of equal duration. This output signal is applied to a buffer amplifier 62, the output of which is the output of the VCO 20.

The dimensions of the channels of the transistors 36 and 38 of the inverter are deliberately selected so that there is an imbalance between them so as to reduce power consumption and minimize AC power noise. Thus, in the present embodiment, the power supply voltage Vcc is equal to five volts and the threshold voltage of the inverter 30 is equal to approximately one volt. In order to further improve the symmetry of the resonant circuit and therefore the symmetry of the sine wave applied to the comparator, the output of the inverter 30 is clamped to a level equal to approximately twice the threshold voltage of the inverter, i.e., to a level of two volts. Since the minimum level of the inverter output is zero volts and the threshold is one volt, the clamping of the output of the inverter to a two volt level (as opposed to allowing it to go to the five volt level of the power supply) further improves the symmetry of the input sine wave. The clamping is accomplished by means of a peak limiter 64 which includes a P-type transistor 66 connected to the output of the inverter 30, an N-type transistor 68 having its gate connected to its drain and to the gate of the transistor 66 and two P-type transistors 70 and 72 connected between the transistor 68 and the power supply. Transistors 68, 70 and 72 form a voltage divider which biases the transistor 66. The bias is selected so that the transistor 66 will start conducting when the output of the inverter 30 is equal to approximately two volts, i.e., twice the switching threshold of the inverter.

The circuit of FIG. 2 also includes elements which enable the VCO to rapidly achieve steady state operation and to start-up at a known phase relation with respect to a control signal. This is accomplished by the provision of a clamp transistor 74 which serves to connect the input of the inverting amplifier 30 to the supply voltage. When the clamp transistor is conducting, it stores energy in the resonant circuit and halts the oscillations of the circuit. The clamp transistor together with output resistor 34 and input protection resistor 32 (both monolithically formed with the active devices of the circuit) allow sufficient energy to be stored in the resonant circuit to aid in quick start-up of the oscillator. When the transistor 74 is shut off by removing the drive signal $\overline{\text{CLAMP}}$ from its base, the energy stored in the resonant circuit causes a voltage to be reflected to the input of the inverting amplifier 30 at a predetermined point in the cycle of the sinusoidal input signal. This enables the circuit to oscillate almost immediately at substantially full amplitude.

When the clamp transistor 74 is conducting, the supply voltage will be applied to the input of the amplifier 30 and the transistor 38 will be rendered conductive. The inductor 24 will appear as a short and the drain to source resistance of the transistor 38 will be negligible. As a result, voltage across the capacitor 26 and varactor 22 will be determined by the relative values of the resistor 32 and resistor 34. In the described embodiment of the invention, the resistor 32 has a value four times that of the resistor 34. With a supply voltage of five volts, there will be approximately a four volt drop across the resistor 32 and a one volt drop across the resistor 34. This provides a constant current through the inductor 24 to store energy in it. In addition, the capacitor 26 is charged to approximately a one volt level, as is the combination of the varactor 22 and capacitors 23 and 25.

When data is to be read, a control circuit (not shown) will turn off the transistor 74 in synchronization with a data signal. This disconnects the supply voltage from the input of the inverting amplifier 30. Since energy is stored in the capacitor 26 and the series combination of the capacitors 23 and 25 and the varactor 22, the one volt level across them will be applied to the input of the inverting amplifier 30. This one volt level is approximately the threshold voltage of the amplifier 30, and oscillations at the steady state level will begin almost immediately. By varying the relative values of the resistors 32 and 34, the start-up phase may be selectively controlled.

In summary, the present invention provides a voltage controlled oscillator which has a precise 50% duty cycle and which is controllable to start up in a predetermined phase at substantially steady state operation. The oscillator is therefore ideally suited for use in a phased-lock loop of a data separator for magnetic discs.

We claim:

1. A voltage controlled oscillator for producing a square wave with a precise duty cycle, comprising:
    oscillating means for generating a periodic signal substantially symmetrical about a central voltage level at a first node;
    means for supplying at a reference node a reference voltage substantially equal to the central voltage level; and
    a two-input comparator with a first input coupled to the first node and a second input coupled to the reference node, the comparator providing a first logic level at a comparator output when the voltage at the first node is greater than the voltage at the second node and otherwise providing a second logic level.

2. The voltage controlled oscillator of claim 1, wherein the oscillating means generates a substantially sinusoidal signal.

3. The voltage controlled oscillator of claim 2, wherein the oscillating means comprises:
    a resonant circuit having two terminals with energy storing elements coupled to the terminals; and
    an inverting amplifier coupled between the two terminals and having a threshold voltage substantially equal to the central voltage.

4. The voltage controlled oscillator of claim 3, wherein the oscillating means further includes peak limiter means coupled to the output of the inverting amplifier for limiting the maximum amplitude of the voltage of the output of the inverting amplifier to about twice the central voltage.

5. The voltage controlled oscillator of claim 4, wherein the peak limiter means comprises a transistor coupled between the output of the inverting amplifer and ground and means for biasing said transistor to conduct whenever the output voltage of the inverting amplifier output exceeds about two times the central voltage.

6. The voltage controlled oscillator of claim 5, wherein the means for providing a reference voltage and the inverting amplifier are included in the same integrated circuit and the inverting amplifier and the means for providing a reference voltage each include at least two field effect transistors of opposite conductivity type, wherein the ratio of the channel dimensions of the two transistors in the inverting amplifier is substantially equal to the ratio of the channel dimensions of the two transistors in the means for providing a reference voltage.

7. A voltage controlled oscillator operative in response to a voltage signal supplied at an input, the voltage controlled oscillator comprising:
    a tuneable resonant circuit coupled to the input and having a resonant frequency that is alterable in response to the voltage signal at the input, the resonant circuit having a first and second terminal and having stored energy elements coupled to the first and second terminals;
    an inverting amplifier having an input and output and a threshold voltage level, the inverting amplifier input and output coupled between the first and second terminals, respectively, thereby causing the resonant circuit to generate a substantially sinusoidal signal, with the frequency of the sinusoidal signal varying in response to the voltage signal at the input; and
    clamp means coupled to the first terminal for conducting current to the stored energy elements to cause them to store energy such that when the clamp means ceases conducting the resonant circuit starts oscillating at a particular pre-designated point in the cycle of the sinusoidal signal.

8. A voltage controlled oscillator as in claim 7, wherein the voltage controlled oscillator has a power supply and the clamp means couples the first terminal to the power supply when the clamp means is conducting.

9. A voltage controlled oscillator as in claim 8, wherein the oscillator further includes a first resistive element coupled to the input of the inverting amplifier and the resonant circuit and a second resistive element coupled to the output of the inverting amplifier and to the resonant circuit wherein the value of the resistive elements determines at what point in the cycle of the sinusoidal signal the resonant circuit will start oscillating when the clamp means ceases conducting.

10. A voltage controlled oscillator as in claim 9, wherein one of the stored energy elements is a capacitor coupled between one of the output terminals and ground such that whenever the clamp means is conducting, the capacitor is charged to a voltage level that occurs in the cycle of the sinusoidal signal.

11. A square wave oscillator comprising:
    a first inverter provided in an oscillator loop for generating a periodic signal, the first inverter having an input signal threshold level at which the output of the first inverter switches from a low state to a high state;
    a second inverter which is substantially a mirror copy of the first inverter, the second inverter having its output coupled to its input to thereby generate a reference level at the input of the second inverter that is mirror-wise related to the input signal threshold level of the first inverter; and
    comparator means, coupled to the input of the first inverter and the input of the second inverter, for detecting whether the input signal level at the input of the first inverter is above or below the reference level generated at the input of the second inverter and for producing an output signal in response thereto.

12. The square wave oscillator of claim 11 wherein the first and second inverters each include an n-type and a p-type field effect transistor.

13. A square wave oscillator according to claim 11 wherein the oscillator loop includes peak limiting means for limiting the output of the first inverter to be substantially symmetrical about its high state-to-low state switching level.

14. A square wave oscillator according to claim 11 further comprising clamping means, responsive to a supplied clamp signal, for holding the oscillator loop in a predetermined DC steady state condition and releasing the oscillator loop from that steady state condition when the clamp signal is switched to thereby initate an oscillation condition in the oscillator loop at a predetermined oscillation phase.

* * * * *